United States Patent [19]

Hall

[11] 4,271,519

[45] Jun. 2, 1981

[54] ADDRESS MARK GENERATION AND DECODING METHOD

[75] Inventor: James B. Hall, Louisville, Colo.

[73] Assignee: Storage Technology Corporation, Louisville, Colo.

[21] Appl. No.: 61,028

[22] Filed: Jul. 26, 1979

[51] Int. Cl.³ .................. G06F 11/10; G06F 13/00
[52] U.S. Cl. .................................. 371/38; 364/900
[58] Field of Search .................. 371/38; 364/200, 900

[56] References Cited

U.S. PATENT DOCUMENTS

| | | | |
|---|---|---|---|
| 3,956,736 | 5/1976 | Jacques et al. | 364/200 |
| 4,034,350 | 7/1977 | Kashio | 364/900 |
| 4,053,944 | 10/1977 | Dixon | 364/900 |

Primary Examiner—David H. Malzahn
Attorney, Agent, or Firm—Woodcock, Washburn, Kurtz, Mackiewicz & Norris

[57] ABSTRACT

This application discloses a method for generating and detecting address marks in data fields which are not provided with readily useful clock pulse means. The method comprises inverting portions of a digital word during writing of an address mark and reinverting words during reading of a record, whereby only inverted, i.e. address mark portions, of said word provide an indication of error-free reading during a read operation provided with error detection means.

12 Claims, 6 Drawing Figures

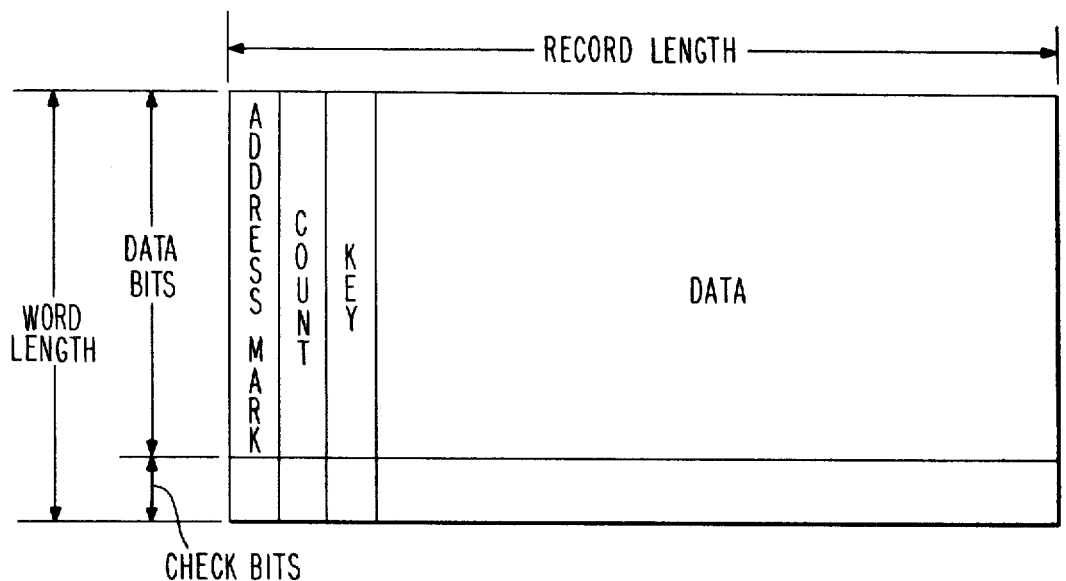
Fig. 1
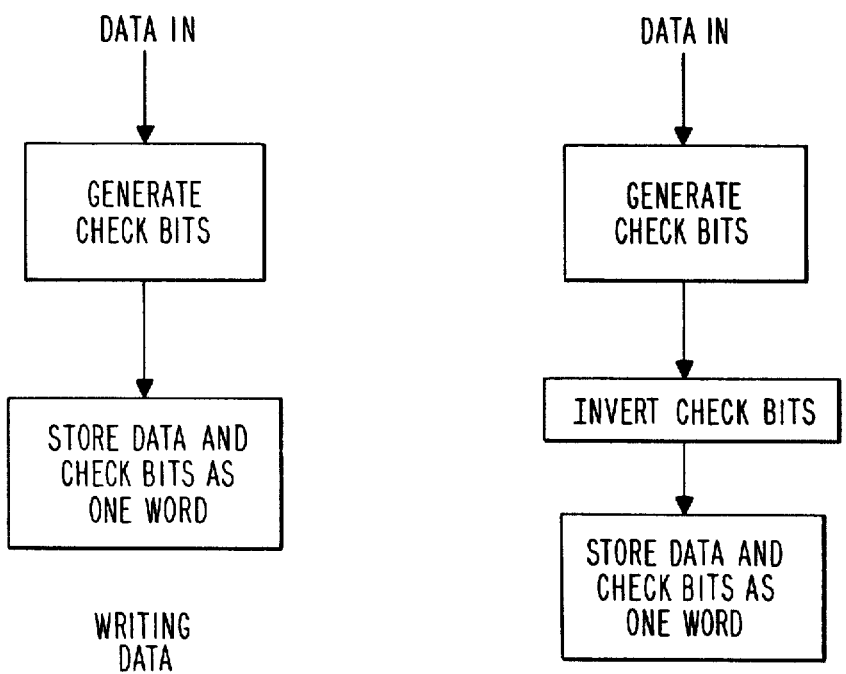
Fig. 2A — WRITING DATA
Fig. 2B — WRITING ADDRESS MARK

READING

SEARCHING
FOR ADDRESS
MARK

ADDRESS MARK GENERATION AND DECODING METHOD

FIELD OF THE INVENTION

This invention relates to methods whereby unique combinations of digital data bits may be generated and later detected so as to provide indications of the starting and, in some cases, the stopping points of digital data records.

BACKGROUND OF THE INVENTION

It has become more and more common in recent years to replace the magnetic tape or disk storage media which in the past were used as bulk digital data storage media with solid state devices, such as for example, charge-coupled devices, as well as metal oxide semiconductor and bipolar solid state memory devices. In many cases, the replacement of magnetic media with solid state devices has posed considerable problems in devising the most efficient ways to use these new media, from both cost and performance standpoints. The situation is further complicated by the fact that it is desirable that solid state memory units designed to replace magnetic units be plug compatible therewith, that is to say, preferably no modifications are required to be made to the host computer unit before the solid state unit can be substituted for a supplanted magnetic storage media. This plug compatability requirement places further constraints on the design of the solid state memory unit. The present invention relates to the provision of address marks which are uniquely coded digital data which are stored along with the information data to which they pertain and which provide an unequivocal indication to a reading unit that the beginning and/or end of a given record of digital data has been reached.

The problem of providing address marks has been treated differently in various prior art memory technologies. For example, in the case of magnetic tape storage media, it is relatively simplified because the tape is sequential, that is, as it can only be unreeled continuously there is no question of saving access time by skipping over intervening data. Therefore, data records stored on tape need only have an address mark at the beginning and end of a given record. Such an address mark has usually been provided by coding together clock pulses (which are reliably detectable in the case of tape because the tape travels at a constant speed) together with particularly selected data pulses. In the case of a magnetic disk record a somewhat different scheme is used, because there the decision must be made as to on which side of which of a number of stacked disks a given record is stored, where along the radius it is stored, and in what sector of the disk it is stored. Given such information, the disk can be subdivided into sufficiently small sections that the address mark need only comprise a single synchronizing pulse per sector, so that it is possible to determine where on the circumference of a given disk the read-write head is at any given time. Again, the constant speed of motion of the disk provides a ready means of synchronizing reading and storage media. As in the case of tape, usually clock pulses together with data bits are encoded at the beginning of a digital data record stored on magnetic disk media; usually the address mark so generated is stored along with count and key data fields, which are used to determine the length and type of the data record. Such clock-pulse synchronous arrangements as discussed above are not applicable to solid state memory media because solid state memory media do not spin or travel at a constant speed and hence cannot be reliably synchronized which is essential if clock-pulses are to be distinguishable from data pulses. In many cases, in fact, there are no clocking means required to operate a solid state memory at all. Therefore, some new means must be found in order to indicate the beginning and/or end of a given data record within a solid state memory media, one which will nevertheless provide a unique and reliable method of detecting the beginning and end of data records.

OBJECTS OF THE INVENTION

It is therefore an object of the invention to provide a method for generating unique address marks useful in solid state digital memory units.

A further object of the invention is to provide a method for detecting such address marks in connection with digital memory units.

Yet another object of the invention is to provide an address mark generating and detecting system which can be incorporated usefully in a solid state memory system.

Still a further object of the invention is to provide a method for generating and detecting address marks within a solid state digital data storage medium which can be readily implemented without adding more than a minimum of additional complexity and cost to the system in which it is used.

A final object of the invention is to provide a method for generating and detecting address marks which uses error correction means already a part of a solid state memory system.

SUMMARY OF THE INVENTION

The above needs of the art and objects of the invention are satisfied by the present invention which utilizes error correction and detection methods in conjunction with additional steps to generate and detect address marks. Such address marks are generated at the time of writing a record into memory by inverting predetermined generated error correction data bits and writing these together with information data as a word of a given data record. When an address mark is being searched for in a solid state memory system, these same predetermined bits of each word are then inverted, causing all the words in the memory other than those which are in fact address marks to be indicated by the error correction means as improperly read or as containing errors. The particular address mark sought for may then be compared with those detected, until the proper address mark has been found which is an indication of the detection of the beginning of the record sought for.

BRIEF DESCRIPTION OF THE DRAWINGS

The invention will be better understood if reference is made to the accompanying drawings in which:

FIG. 1 represents the layout of a typical data record;

FIG. 2a represents the write process for data;

FIG. 2b represents the write operation when an address mark is being written;

FIG. 3b represents the read operation when an address mark is being sought for.

DESCRIPTION OF THE PREFERRED EMBODIMENTS

Figure 3A:
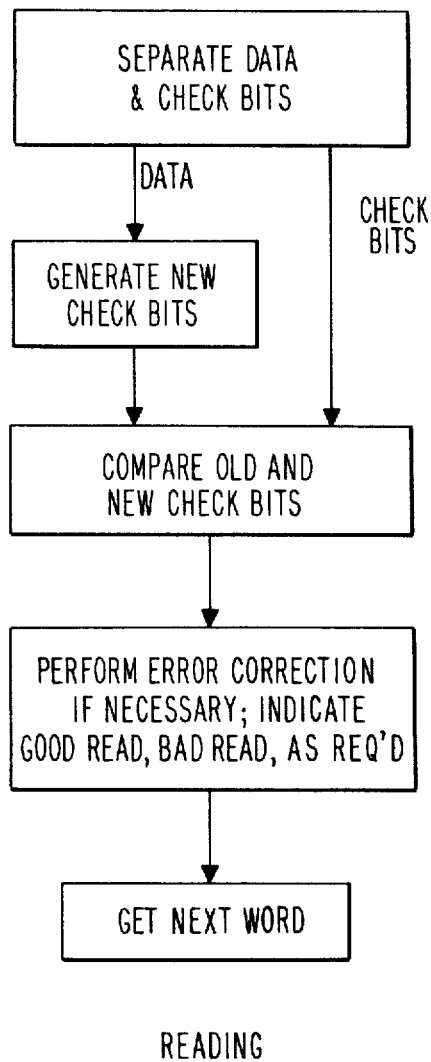
FIG. 3a represents the read operation for data.

The present method for generating and detecting address marks within solid state digital data records should desirably be read in conjunction with copending commonly assigned applications Ser. No. 61,026, filed July 26, 1979, which covers a fast access memory having a specific organization of charge-coupled device chips for the storage of digital data therein and Ser. No. 61,025, filed July 26, 1979, which shows error detection and correction methods used therewith. Both applications are hereby incorporated herein by references; the subject matter of these applications will be explained herein only insofar as is necessary for understanding of the present invention. Briefly, Ser. No. 61,026, filed July 26, 1979, discloses that advantageously a matrix of CCD chips may be arranged in an array, preferably 72 deep by 24 wide, for a total of 1728 CCD chips. A given 72-bit data word is read into the 72 chips of a given column simultaneously, one bit into each chip. The chips are synchronized so that each bit is fed into the same location on its chip; in a preferred embodiment, Texas Instruments chips having 64 K locations or storage of digital bits each organized into 16 loops of 4096 bits were used.

It is also disclosed in said patent application that desirably the 72 bits comprise 64 bits of data (information bits) along with 8 check bits or error correction bits, generated from the 64 information bits. Thus, a 72 bit word is made up largely of information but also of error correction bits. These error correction bits are generated within the memory system itself and are used to detect whether errors have occurred during the storage of digital data. The method of error detection and correction used is the subject of copending application Ser. No. 61,025, filed July 26, 1979. Broadly stated, 8 unique error code or check bits are generated at the time of storage of 64 information bits and are stored therewith to comprise a 72 bit word. When it is desired to read the information, the 64 information bits are passed through the same check-bit generating algorithm as originally generated the 8 check bits, thus generating 8 new check bits. If no errors have occurred in storage, the new check bits will be identical with the old. If an error has occurred, however, they will differ; an exclusive-OR logical process may then be used to generate an error signal "syndrome" which in turn can be used to access a ready only memory (ROM) to identify the offending bit. This bit may then be inverted, since in a digital embodiment only the location of a bit in error need be specified in order to correct the error, inversion always being the proper method of correcting an error.

The above referred to copending application Ser. No. 61,025, filed July 26, 1979, also contains additional disclosure, not relevant to the present application, including means for detecting and correcting two errors under certain circumstances and means for determining whether a read operation has been performed without any errors at all.

As discussed above, the provision of an address mark in a system such as a solid state memory system which does not have a fixed "clock" or source of regular pulses built into its method of operation can pose some difficulty. One possibility would be to provide a word or group of words with a unique data pattern which might be sought for when address mark detection is to be performed. However, this poses the difficulty that all data to be stored must then be examined to make sure that it would not itself set up this sort of pattern which would lead to confusion and detection of an address where, in fact, none existed. Therefore, it is desirable to use some other feature of the system within which the address mark method is to be implemented to perform this additional function. This is what has been done here; specifically, the error detection method discussed above has been used by the inventor of the present invention in order to provide a method for generating and detecting address marks, which will now be described in detail.

Referring now to FIG. 1 an overall view of a record according to the present invention is shown. It comprises a block a word length deep by a record length wide. The depth dimension, equal to the word length, is divided into data bits and check bits while the record length is divided into an address mark, a count field, a key field and, of course, the data field itself. The count and key fields are precisely equivalent to the prior art expedients for determining the length of a field, once an address mark has been detected. The data bits, of course, are the information sought to be stored whereas the check bits are generated therefrom as will be discussed in further detail below, for error detection and correction purposes. As discussed above, a word in a preferred embodiment is 72 bits long, 64 of which are data, the 8 remaining being check bits. The record length may typically be 1000 to 2000 words.

Referring now to FIG. 2a it will be seen how the error correction bits are ordinarily generated by the process discussed in copending application Ser. No. 61,025, filed July 26, 1979. As discussed therein, the usual process, that is, when data is being stored, is to bring the data into an arithmetic and logic unit and generate a plurality of check bits according to a predetermined algorithm which may comprise a sequence of mathematical instructions or may be a "hard-wired" circuit. In a preferred embodiment discussed in copending application Ser. No. 61,025, filed July 26, 1979, referred to above, the algorithm takes the form of a Hamming code. The data bits and the check bits thus generated are then stored as a word. Referring now to FIG. 3a, the read operation as executed when data is sought to be read is shown. The first step is to separate the data from the check bits of a given word. The data bits are operated upon according to an algorithm similar to that used to generate the original check bits to generate a new set of check bits. The newly generated and the old check bits are then compared in order to determine whether the data bits have changed between the times of the two generations. This is, of course, to show whether any errors have occurred in the data bits during storage. If the two sets of data bits differ, means are provided whereby data bits in error may be corrected by inversion. In some cases, a plurality of data bits may be corrected. In any case, an indication is provided as to whether a "good read" has been performed on each word, i.e. whether errors were found or not. This fact is used in the detection of address marks according to the present invention, which will now be explained.

Referring to FIG. 2b, it will be shown how the write operation is modified when it is sought to write an address mark. The signal indicating that an address mark is to be written is external to the present invention, and may be transmitted to a memory control unit by a host computer. What is done is that a specific set of information bits are passed to the same write means perform the functions discussed in connection with FIG. 2a above. In this case, the specific information bits are preselected so as to be unique to the particular record stored. In a preferred embodiment, this address mark may comprise a single byte repeated eight times to make up the 64 bits of the information, for insurance' sake. The check bits are then generated in the same fashion as done when writing data. However, at least some of them are then altered according to a preselected, reversible pattern. That is to say, for example, the first four check bits might be inverted, i.e. all the zeros therein changed to ones and the ones to zeros. Alternatively, the sequence of check bits could be reversed or otherwise modified. (It will be apparent to those skilled in the art that such reversal could lead to ambiguities. However, if, as discussed above, the information bits are chosen to uniquely identify the record, they can also be so chosen as to be variant under reversal.) The thus at least partially inverted check bits and the information bits are then stored as the first word of a record shown as in FIG. 1.

Figure 3B:
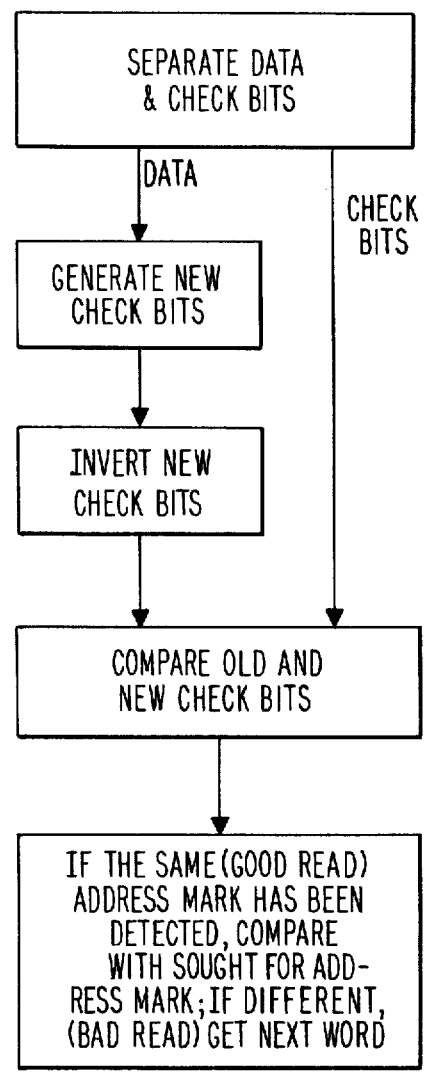

Referring now to FIG. 3b, when it is sought to detect an address mark, a read operation is performed on successive words of records stored in a solid state memory device with the change that the same check bits which were inverted or otherwise operated on during the write operation discussed above in connection with FIG. 2b, are re-inverted or re-reversed so as to return them to their original order. This means that when these check bits are compared with those stored, (i.e., which were also at least partially operated upon) they will match and a "good read" will be indicated. Check bits of the non-address mark portions of each record, not having been inverted during the write stage, will be inverted during the read stage when an address mark is being sought and thus will not match the regenerated and inverted check bits; a "bad read" will be indicated. Therefore, the process of detecting an address mark comprises the additional steps to the normal read operation of inverting a predetermind sequence of check bits and presuming an address mark is found when a good read is indicated. In the vast majority of cases, of course, a bad read will be indicated since there will be a multiple bit "error" when data is thus operated upon. The precise multiplicity is dependent on the number of bits inverted in the read stage when the address is written. A bad read thus will indicate that an address mark has not been detected; the operation will then proceed to the next word. According to certain addressing and formatting considerations discussed in copending Ser. No. 61,026, filed July 26, 1979, the next word of a given record may not be adjacent thereto in a given column of solid state devices. However, this feature is not critical with respect to the present invention.

Figure 4:
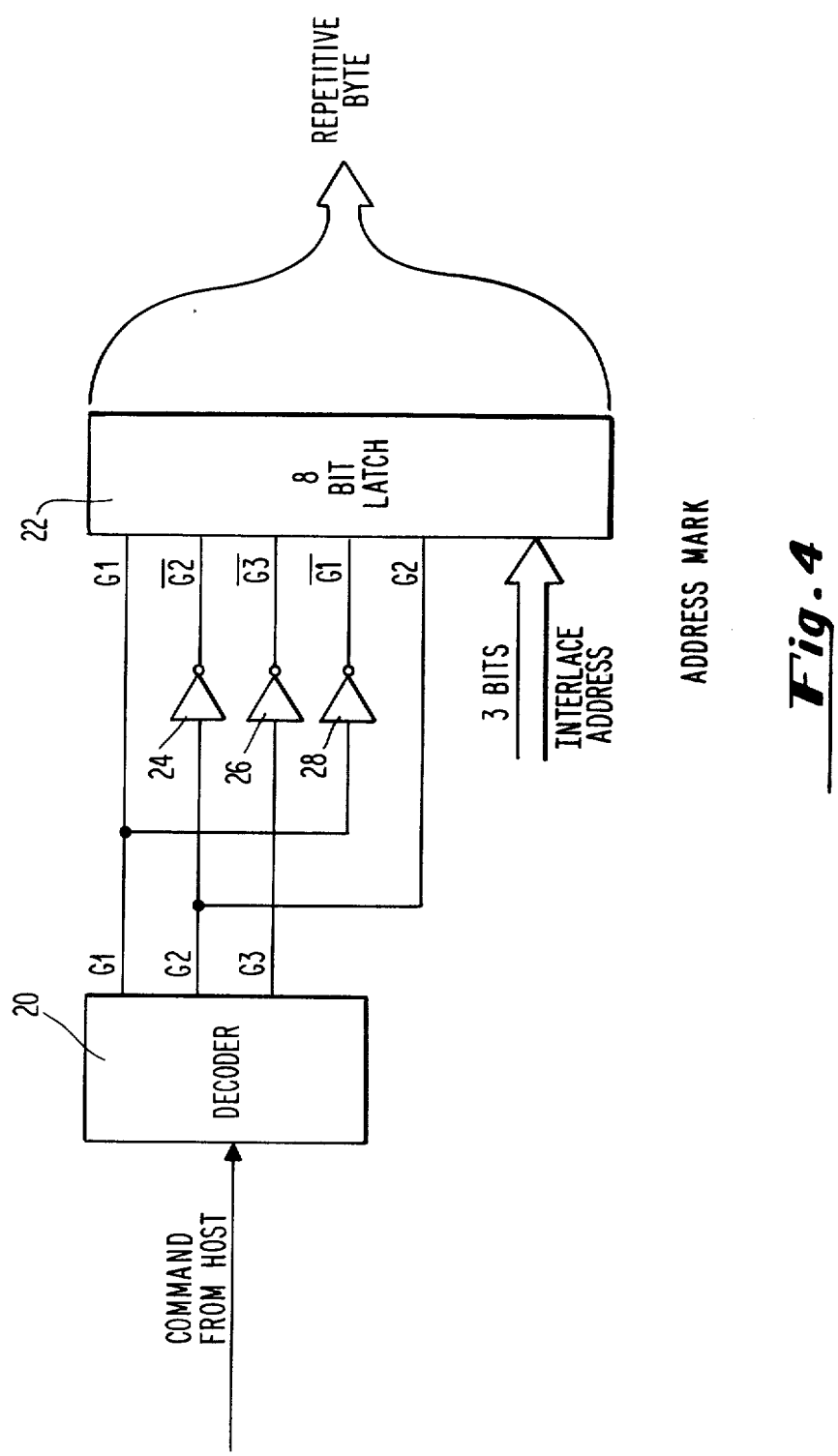
FIG. 4 represents hardware useful in the generation of an address mark according to the invention.

Referring now to FIG. 4, hardware useful in generating address marks according to the invention is shown. A command from a host computer (not shown) is passed to a decoder 20 which together with inverters 24, 26, 28 generates one of three address bytes G1, G2, G3. In a preferred embodiment, these are as follows:

G1=11100XXX

G2=00111XXX

G3=01010XXX where XXX are interlace address bits in accordance with the interlacing scheme discussed in copending application Ser. No. 61,026, filed July 26, 1979. It will be appreciated that the first five bits of G1-G3 as above each vary by more than a single bit from each other; in this way, no single bit changed can create one of the other two address marks.

If the host computer designates G1, for example, the line labeled G1 from the decoder 20 will be one and those labeled G2 and G3 will be zero. Reading down the left side of 8-bit latch 22, the first input will be G1 or one; the second, G2 inverted, by inverter 24, or one; the third, G3 inverted by inverter 26, or one; the fourth, G1 inverted by inverter 28 or zero; and the fifth, G2, or zero. The sixth, seventh and eighth bits of the address byte are the X's of the interlace address as mentioned above. In this way the 11100XXX G1 pattern is generated; G2 and G3 are generated similarly when called for. The pattern thus generated is replicated 8 times and becomes a 64-bit word; the check bits generated are inverted during the write operation, and are reinverted during the read operation, as discussed above.

Upon detecting an address mark, the bits stored in the information section of the address mark word may then be compared with the address mark provided by the host computer or other data control means in order to determine whether the record found is in fact the one sought. If not, the process may then simply be continued until the next address mark is found.

It will be appreciated that there has been described a method whereby an address mark may be generated and detected in a solid state memory device using means which were largely already present for error detection and correction purposes. This, of course, means that very little additional structure need be added to allow the practice of the process of the invention. Morever, these added means may be hard-, firm- or soft-ware depending on the particular implementation chosen. For example, the comparison of newly generated check bits with old check bits can be by an exclusive-OR process or may be done by a well understood microcode process. Similarly, the check bits may be generated according to an arrangement of logic gates or may be done according to a microcoding process. In either case, these means are well understood by those skilled in the art.

Further, it will be understood by those skilled in the art that there are other processes other than simple inversion which may be performed on particular check bits in order to make them suitable for address marking purposes, and that certain of the information bits might also be inverted with this end in mind with the same result. In this case, of course, the inversion step would take place before the generation of check bits in FIG. 2b and likewise reinversion would be performed before generation of new check bits in FIG. 3b.

Finally, it will be understood by those skilled in the art that the invention may be used with other coding expedients than the Hamming codes discussed above. In particular, where any unique operation is to be performed on data prior to storage (here the generation of check bits), certain of the output of that operation may be reversed to provide an address mark; when the operation is reperformed, so to speak, in the read stage the same certain part of the output may be re-reversed. Thus, the provision of double inversion for address mark detection while information data is only inverted during the address mark search stage provides a method for differentiating between address mark and otherwise indistinguishable information data bits; a signal (here a "bad read" indication) must be provided upon a read stage which can be triggered either positively or negatively by the presence of once inverted data. A consideration which must be borne in mind is that the inversion operation must differ in parity from any other inversion operations; for example, in copending application Ser. No. 61,025, filed July 26, 1979, four check bits are inverted to prevent the occurrence of words comprising of all ones or all zeroes. Clearly if four of the check bits of an address mark are inverted, confusion is possible. Therefore, it will be appreciated that the description of the invention given above is exemplary only and is not intended to be a limitation upon its scope, which is more properly defined by the appended claims.

What is claimed is:

1. In a method for storing digital data comprising a write stage, during which said data is written to a data storage medium, and a read stage, during which said data is read from said medium, in which said data is divided onto records, said records being comprised of words made up of bits, said write stage comprising the step of generating first encoded error-correction data, corresponding to supplied information data, each word comprising information data and encoded error-correction data and said read stage comprising the steps of regenerating second similarly encoded error-correction data with respect to the information data contained within each word, comparing said first and second error-correction data and, in response to the outcome of such comparison step, indicating whether said data has been read properly, or whether a multiple-bit error has occurred, the improvement comprising a method for generating and detecting address marks to indicate ends of said records, said method comprising the following steps:

generating an address mark for one of said records during said write stage by providing predetermined information data, generating corresponding first encoded error-correction data, said information data and error correction data forming a word, performing a predetermined reversible step on at least part of said word, and storing the result as the address mark of said record; and detecting said address mark during said read stage by regenerating second similarly encoded error-correction data, with respect to each word, performing the inverse of said predetermined reversible step on said at least part of each word, performing said comparison step on each word, and concluding that a word is an address mark when the outcome of said comparison step indicates that the data of said word has been read properly.

2. The method according to claim 1, wherein the predetermined information data of said address mark is utilized for distinguishing said address mark from other address marks.

3. The method of claim 1 wherein said address mark forms the first stored word of each said record.

4. The method of claim 1 wherein said predetermined reversible step comprises inversion of at least some of the bits comprised by the word forming the address mark.

5. The method of claim 1 wherein said at least part of the word forming the address mark on which said predetermined reversible step is performed comprises preselected ones of the bits of said first error-correction data.

6. The method of claim 1 wherein said predetermined reversible step comprises reversal of the order of preselected bits of said address mark.

7. Method for generating and detecting an address mark for indicating an end of a data record comprising words, wherein said method for generating an address mark comprises the step of:

during the writing of a record onto a storage medium, performing a reversible operation on preselected bits of at least one word of said record to generate an address mark and wherein said method for detecting said mark comprises the steps of:

reading each word of a record, performing the reverse of said operation on each word of said record and providing an error signal at all times during the reading of said record except when said address mark is read.

8. The method according to claim 7 wherein said reversible operation is inversion of the value of said preselected bits.

9. The method according to claim 7 wherein said preselected bits are part of generated error-correction data stored as part of each word.

10. The method according to claim 9 wherein said error signal is generated according to comparison between said generated error correction data bits and error correction data bits regenerated during the reading of said record.

11. A method for generating and detecting address marks for use in a data storage system of the type wherein data is stored in records comprised of words, said records being separated from one another by address marks, wherein during a write mode in which information data is written to a data storage medium said information data is operated on according to a first predetermined sequence of steps to generate first error correction data corresponding to said information data, said first error correction data being stored together with said information data, and wherein during a read mode in which said record is read from said data storage medium said information data is again operated on according to said first predetermined sequence of steps to generate second error correction data, and a comparison step is performed during which said first stored error correction data is compared to said second error correction data, and an error signal is provided when the results of said comparison indicate that said first and second error correction data are not identical;

wherein said method for generating an address mark comprises the steps of operating on predetermined information data according to a second predetermined sequence of steps to generate first additional data and storing said first additional data together with said predetermined information data to form an address mark having a format identical to the words of said record; and wherein said method for detection of said address mark comprises the steps of operating on the information data of each word of said record according to said second predetermined sequence of steps to generate second additional data, performing said comparison step on the second additional data generated by said operation and the first additional data stored as part of the words of said record, and determining that an address mark has been detected when the results of said comparison step indicates that said record has been read without errors.

12. The method of claim 11 wherein said second predetermined sequence of steps comprises said first predetermined sequence of steps.

* * * * *

UNITED STATES PATENT AND TRADEMARK OFFICE
CERTIFICATE OF CORRECTION

PATENT NO. : 4,271,519
DATED : June 2, 1981
INVENTOR(S) : James B. Hall

It is certified that error appears in the above–identified patent and that said Letters Patent are hereby corrected as shown below:

Column 7, line 22, insert --written-- after "each word."

Signed and Sealed this

Twenty-second Day of September 1981

[SEAL]

Attest:

Attesting Officer

GERALD J. MOSSINGHOFF
Commissioner of Patents and Trademarks